(12) United States Patent
Inao et al.

(10) Patent No.: US 9,653,337 B2
(45) Date of Patent: May 16, 2017

(54) TRANSPORT ARM, TRANSPORT APPARATUS AND TRANSPORT METHOD

(71) Applicant: Tokyo Ohka Kogyo Co., Ltd., Kawasaki (JP)

(72) Inventors: Yoshihiro Inao, Kawasaki (JP); Satoshi Kobari, Kawasaki (JP); Akihiko Nakamura, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 227 days.

(21) Appl. No.: 14/071,060

(22) Filed: Nov. 4, 2013

(65) Prior Publication Data
US 2014/0169929 A1    Jun. 19, 2014

(30) Foreign Application Priority Data
Dec. 14, 2012    (JP) ................... 2012-273989

(51) Int. Cl.
*H01L 21/683*    (2006.01)
(52) U.S. Cl.
CPC .................. *H01L 21/6838* (2013.01)
(58) Field of Classification Search
CPC ............ H01L 21/6838; H01L 21/683
USPC ............. 414/800; 901/40; 294/188, 189
See application file for complete search history.

(56) References Cited

U.S. PATENT DOCUMENTS 3,640,562 A * 2/1972 Creskoff ............... B66C 1/0293
248/363
3,863,969 A * 2/1975 Weiss .................... B66C 1/0212
294/189
4,029,351 A * 6/1977 Apgar ................... B66C 1/0212
271/97
4,389,064 A * 6/1983 Laverriere ............. B66C 1/025
209/905
4,767,142 A * 8/1988 Takahashi ............. B25B 11/007
285/261
5,127,692 A * 7/1992 Yakou .................. B25J 15/0616
294/183
H001373 H * 11/1994 Durham ............. H01L 21/6838
294/188
5,765,889 A * 6/1998 Nam .................... B25J 15/0616
414/752.1

(Continued)

FOREIGN PATENT DOCUMENTS

JP    H01-132365 U    9/1989
JP    06-345262       12/1994

(Continued)

OTHER PUBLICATIONS

"Teflon PTFE fluoropolymer resin Properties Handbook", Jul. 1996, DuPont.*

(Continued)

*Primary Examiner* — Michael McCullough
*Assistant Examiner* — Lynn Schwenning
(74) *Attorney, Agent, or Firm* — Knobbe, Martens Olson & Bear, LLP

(57) ABSTRACT

A transport arm including a holding unit that holds a substrate by vacuum adsorption. The holding unit has an air discharge port and an adsorption member formed so as to surround the air discharge port. The adsorption member is a squeeze packing.

9 Claims, 4 Drawing Sheets

(56) References Cited

U.S. PATENT DOCUMENTS

| | | | | |
|---|---|---|---|---|
| 5,879,040 A * | 3/1999 | Nagai | ................. | F16B 47/00 |
| | | | | 279/3 |
| 6,196,532 B1 * | 3/2001 | Otwell | ................. | B25B 11/005 |
| | | | | 269/21 |
| 6,279,976 B1 * | 8/2001 | Ball | ................. | B65G 47/91 |
| | | | | 279/3 |
| 6,322,116 B1 * | 11/2001 | Stevens | ................. | B25B 9/00 |
| | | | | 294/64.3 |
| 6,499,777 B1 * | 12/2002 | Wang | ................. | C30B 35/005 |
| | | | | 118/728 |
| 6,692,219 B2 * | 2/2004 | Coomer | ................. | H01L 21/68707 |
| | | | | 294/188 |
| 6,896,304 B2 * | 5/2005 | Li | ................. | H01L 21/67259 |
| | | | | 294/185 |
| 6,942,265 B1 * | 9/2005 | Boyd | ................. | H01L 21/67742 |
| | | | | 294/189 |
| 7,055,875 B2 * | 6/2006 | Bonora | ................. | H01L 21/6838 |
| | | | | 294/188 |
| 7,144,056 B2 * | 12/2006 | Casarotti | ................. | H01L 21/67259 |
| | | | | 294/186 |
| 2003/0008602 A1 * | 1/2003 | Ashjaee | ................. | B24B 37/30 |
| | | | | 451/54 |
| 2003/0052495 A1 * | 3/2003 | Casarotti | ................. | H01L 21/67259 |
| | | | | 294/188 |
| 2003/0234548 A1 * | 12/2003 | Aggarwal | ................. | H01L 21/6838 |
| | | | | 294/188 |
| 2005/0052041 A1 * | 3/2005 | Bonora | ................. | H01L 21/6838 |
| | | | | 294/188 |
| 2007/0214925 A1 * | 9/2007 | Nishio | ................. | B28D 1/226 |
| | | | | 83/401 |
| 2008/0105128 A1 * | 5/2008 | Yang | ................. | B25J 15/0616 |
| | | | | 96/113 |
| 2009/0033111 A1 * | 2/2009 | Hupp | ................. | B66C 1/0212 |
| | | | | 294/189 |
| 2009/0096229 A1 * | 4/2009 | Bonora | ................. | H01L 21/6838 |
| | | | | 294/188 |
| 2010/0248446 A1 * | 9/2010 | Liu | ................. | H01L 21/304 |
| | | | | 438/459 |
| 2010/0290886 A1 * | 11/2010 | Hashimoto | ................. | B25J 9/042 |
| | | | | 414/800 |
| 2012/0235335 A1 * | 9/2012 | Hayashi | ................. | H01L 21/6838 |
| | | | | 269/21 |
| 2013/0082475 A1 * | 4/2013 | Fukano | ................. | B65G 47/91 |
| | | | | 294/188 |

FOREIGN PATENT DOCUMENTS

| | | |
|---|---|---|
| JP | 2002-299416 | 10/2002 |
| JP | 2005-123642 | 5/2005 |
| JP | 2006-024683 A | 1/2006 |
| JP | 2007-324169 | 12/2007 |
| JP | 2011-187566 | 9/2011 |
| JP | 2011-253918 | 12/2011 |
| JP | 2012-023174 | 2/2012 |

OTHER PUBLICATIONS

Schmalz, "Innovative Vacuum for Automation; Vacuum Components Catalog 2013/2014", Nov. 2013; pp. 17-62.*

* cited by examiner

TRANSPORT ARM, TRANSPORT APPARATUS AND TRANSPORT METHOD

CROSS-REFERENCE TO RELATED APPLICATIONS

Priority is claimed on Japanese Patent Application No. 2012-273989, filed Dec. 14, 2012, the content of which is incorporated herein by reference.

BACKGROUND OF THE INVENTION

Field of the Invention

The present invention relates to a transport arm, a transport apparatus, and a transport method which hold and transport a substrate.

Background Art

For example, as a transport arm that holds and transports a substrate, Patent Literature 1 discloses a transport arm having a recess to avoid contact with the held substrate at a side of an arm main body where the substrate is supported. Specifically, in the arm main body of the transport arm disclosed in Patent Literature 1, a tip portion thereof includes an adsorption unit that holds a central portion of the substrate byway of vacuum adsorption. In addition, Patent Literature 2 discloses a transport mechanism that adsorbs and holds the substrate by using an adsorption hole formed on a lower surface side of a hand body. Further, Patent Literature 3 discloses a substrate transport apparatus where at least three holding units are arranged in parallel and at least two adsorption units are disposed in each holding unit so as to be position-adjustable along a longitudinal direction. Then, in general, the adsorption unit of the transport arm is formed of materials having stiffness such as aluminum, stainless steel and ceramics, or a material such as rubber.

CITATION LIST

Patent Literature

Patent Literature 1
Japanese Patent Application Publication, Tokukai, No. 2007-324169 (Publication Date: Dec. 13, 2007)
Patent Literature 2
Japanese Patent Application Publication, Tokukai, No. 2005-123642 (Publication Date: May 12, 2005)
Patent Literature 3
Japanese Patent Application Publication, Tokukai, No. 2002-299416 (Publication Date: Oct. 11, 2002)

SUMMARY OF THE INVENTION

Technical Problem

The transport arm disclosed in Patent Literature 1 has the recess to avoid contact with the held substrate, and specifically is configured, for example, assuming that the substrate at a room temperature which is to be transported to a substrate inspection apparatus is held. That is, the adsorption unit in the transport arm disclosed in Patent Literature 1 is configured assuming that the substrate having a small warp at the room temperature is held. In addition, even the transport mechanism disclosed in Patent Literature 2 or the substrate transport apparatus disclosed in Patent Literature 3 is configured assuming that the substrate at the room temperature is held and transported. For that reason, the transport arm and the like which are disclosed in Patent Literature 1, Patent Literature 2 and Patent Literature 3 do not assume that for example, the substrate after heat treatment, that is, the heated substrate is held and transported. Therefore, no technical consideration is given to a case where the heated substrate having a warp is held and transported or a case where the held substrate is detached from the transport arm in a stable manner (without adhering to the transport arm). In addition, in general, when rubber (pad) is used for the adsorption unit in the transport arm, adhesive force and friction coefficient are large, thereby causing poor detachability. If the heated substrate is adsorbed, the substrate eventually adheres to the transport arm.

However, for example, in a wafer handling system which holds strength of a wafer by adhering a support plate to the wafer to be ground and prevents a crack and the warp from appearing on the wafer, there exists a heat-treatment process in which a laminated body formed by adhering the wafer and the support plate together is subjected to heat treatment at a high temperature (100° C. to 300° C.). Therefore, there has been a need for the transport arm that holds and transports the substrate after the heat treatment, that is, the heated substrate, in particular, the transport arm that holds and transports the heated substrate having the warp caused by heating.

The present invention is made in view of the above-described circumstances, and a main object thereof is to provide a transport arm, a transport apparatus and a transport method which can hold the substrate having the warp, the heated substrate, and particularly, the heated substrate having the warp, and which can stably transport the substrate from a certain process to the next process, and which can stably detach the held substrate therefrom.

Solution to Problem

In order to solve the above problems, a transport arm according to the present invention which holds and transports a substrate includes a holding unit that holds the substrate by way of vacuum adsorption. The holding unit has an air discharge port and an adsorption member formed so as to surround the air discharge port. The adsorption member is a squeeze packing.

In addition, a transport apparatus according to the present invention includes the transport arm and a drive unit that drives the transport arm. Furthermore, a transport method according to the present invention includes a transport process of holding and transporting a substrate by using the transport arm.

Advantageous Effects of Invention

According to the transport arm of the present invention, since the adsorption member is the squeeze packing, when the substrate is subjected to the vacuum adsorption, the substrate and the squeeze packing come into close contact with each other. In contrast, when the vacuum adsorption is released, the substrate is easily detached from the squeeze packing. For that reason, according to the transport arm, the transport apparatus and the transport method of the present invention, it is possible to stably hold and transport the substrate having the warp, the heated substrate, and particularly, even the heated substrate having the warp from a certain process to the next process, and it is possible to stably detach the held substrate therefrom.

DETAILED DESCRIPTION OF THE PREFERRED EMBODIMENTS

Figure 1:
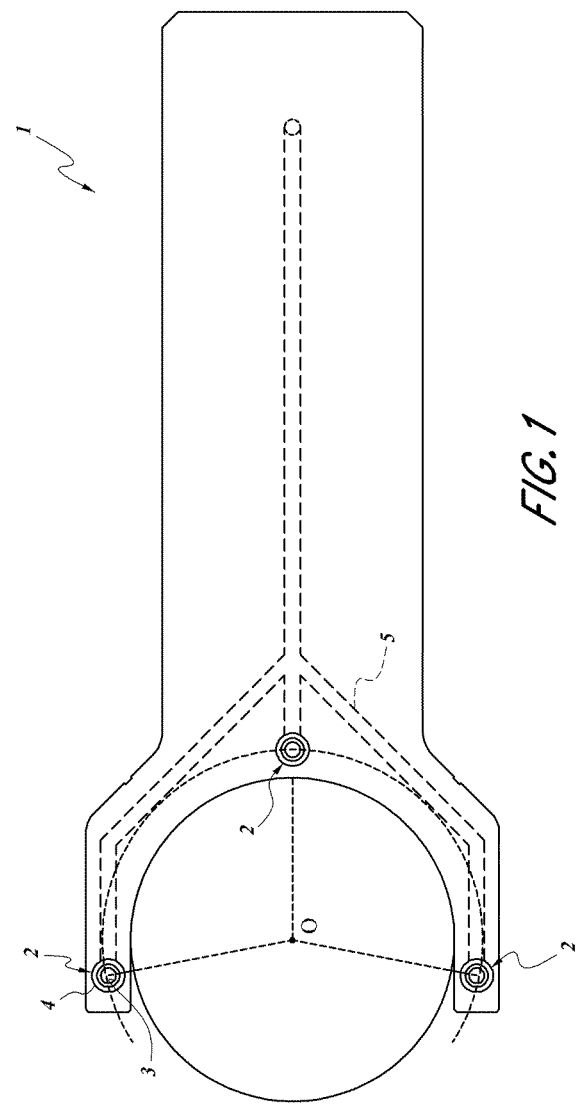
FIG. 1 is a plan view illustrating a schematic configuration of a transport arm according to an embodiment of the present invention.

A transport arm according to the present invention which holds and transports a substrate includes a holding unit that holds the substrate by way of vacuum adsorption. The holding unit has an air discharge port and an adsorption member formed so as to surround the air discharge port. The adsorption member is configured to be a squeeze packing.

In addition, a transport apparatus according to the present invention includes the transport arm and a drive unit that drives the transport arm. Furthermore, a transport method according to the present invention includes a transport process of holding and transporting a substrate by using the transport arm.

Substrate

First, hereinafter, a substrate which is held and transported by the transport arm according to the present invention will be described.

The substrate to be held and transported in the present invention is not particularly limited, but is preferably a substrate to be used in a wafer handling system. That is, it is preferable to use the substrate which is subjected to processes of thinning, transporting and mounting in a state of being supported by (adhered to) a support plate. The substrate is not limited to a wafer substrate (silicon wafer), but for example, may be any substrate such as a ceramic substrate, a thin film substrate and a flexible substrate which need to be supported by the support plate.

In the wafer handling system, the substrate is used as a laminated body formed such that the substrate, an adhesion layer containing a thermoplastic resin for example, and the support plate (support body) for supporting the substrate are laminated in this order. The laminated body is formed such that the substrate, the adhesion layer and the support plate are laminated in this order by applying an adhesive to any one of the substrate and the support plate.

The support plate is the support body for supporting the substrate and adheres to the substrate via the adhesion layer. Therefore, the support plate may be sufficiently used as long as the support plate has strength required for preventing damage or deformation of the substrate when the substrate is subjected to processes of thinning, transporting and mounting. A lighter support plate is preferable. In view of the foregoing, it is more preferable to configure the support plate by using glass, silicon, acrylic resin or polyimide.

For example, as an adhesive material, the adhesive configuring the adhesion layer may contain the thermoplastic resin whose thermal fluidity is improved by heating. For example, the thermoplastic resin includes acrylic resin, styrene resin, maleimide resin, hydrocarbon resin and elastomer. A forming method of the adhesion layer, that is, an application method of applying the adhesive to the substrate or the support plate, or a forming method of forming an adhesive tape by applying the adhesive to the substrate is not particularly limited. In addition, a thickness of the adhesion layer may be appropriately set according to types of the substrate and the support plate which are to be adhered, a difference in levels of a substrate surface, and a process to which the substrate is subjected after adhering.

In addition, as long as the adhering is not interfered, other layers except for the adhesion layer may be further formed between the substrate and the support plate. For example, a release layer whose property is changed by emitting light thereto may be formed between the support plate and the adhesion layer. Since the release layer is formed, it is possible to easily separate the substrate from the support plate by emitting the light thereto after the processes of thinning, transporting and mounting of the substrate.

The forming method and the forming apparatus of forming the laminated body, that is, the forming method of the adhesive layer or the adhesive layer forming apparatus and a superposing method or a superposing apparatus of the substrate and the support plate are not particularly limited, but can employ various methods or apparatuses. For example, as the forming method of the adhesive layer, it is possible to form the adhesive layer in such a manner that the adhesive tape formed by applying the adhesive adheres to any one of the substrate and the support plate. In the present invention, the substrate may be sufficiently used, if the substrate is the laminated body when being held and transported by the transport arm.

In general, before adhering to the support plate, the substrate has been already warped to some extent (not a flat plate in a strict sense). If the substrate is subjected to the heat-treatment process in a state adhering to the support plate, the substrate is further largely warped due to a difference in thermal expansion coefficients with the support plate (for example, approximately maximum 1,000 μm in a case of the substrate of 300 mm in diameter, and approximately maximum 700 μm in a case of the substrate of 200 mm in diameter). That is, the laminated body including the substrate is in a heated state and has a warp after the heat treatment. Therefore, the substrate to be held and transported by the transport arm according to the present invention is the substrate having the warp or the heated substrate, particularly the heated substrate having the warp. The "substrate" held and transported by the transport arm according to the present invention also includes the above-described "laminated body".

Transport Arm

Next, hereinafter, the transport arm according to the present invention will be described with reference to FIGS. 1 to 4.

The transport arm according to the present invention is adapted to hold a rear surface of the substrate (surface having no device; in a case of the laminated body, a surface of the support plate side). The transport arm may hold the substrate from above or may hold the substrate from below. It is preferable to hold the substrate from below.

As illustrated in FIG. 1, a transport arm 1 according to an embodiment of the present invention includes a holding unit 2 that holds a substrate (not illustrated) by way of vacuum adsorption. The holding unit 2 has an air discharge port 3 and an adsorption member 4 formed so as to surround the air discharge port 3. The adsorption member 4 is the squeeze packing.

The transport arm 1 may be sufficiently used as long as the transport arm 1 has strength required for holding the substrate. The lighter transport arm 1 is preferable. In view of the foregoing, it is preferable to form the transport arm 1 by using aluminum, stainless steel and ceramics which have stiffness. It is more preferable to form the transport arm by using the ceramics. The transport arm 1 whose outer appearance is schematically a thin rectangular plate shape and a tip side which holds the substrate is formed, that is, a side including the holding unit 2 is formed to be divided in two. In this manner, the transport arm 1 is facilitated to hold and transport the substrate, and has achieved weight reduction. A terminal side of the transport arm 1, that is, a side excluding the holding unit 2 is connected to a drive unit (not illustrated) that drives the transport arm 1. An outer shape of the transport arm 1 may be any shape as long as the outer shape does not have an adverse effect on the substrate which is held and transported.

The number of the holding units 2 included in the transport arm 1 may be at least one, but it is more preferable to include at least three so as to stably hold the substrate. That is, as illustrated in FIG. 1, it is more preferable that the transport arm 1 include at least three holding units 2.

Then, when the transport arm 1 includes three holding units 2, three holding units 2 may be arranged on the transport arm 1 such that an angle formed by two mutually adjacent holding units 2 equiangular (120°) with respect to a center of a circle passing through three holding units 2, or alternatively, as illustrated in FIG. 1, may be arranged on the transport arm 1 so as to have mutually different angles formed by two mutually adjacent holding units 2 with respect to a center O of the circle passing through three holding units 2 (in FIG. 1, the circle illustrated by a dashed line). Specifically, for example, in FIG. 1, the angle formed by two holding units 2 located at tip portions of the transport arm 1 which is formed to be divided in two is wider than the angle formed by a third holding unit 2 formed at a root of two divided portions and the holding unit 2 located at the tip portion. In this manner, the transport arm 1 easily holds the substrate without adversely affecting an operation of other apparatuses. A preferred arrangement of three holding units 2 in the transport arm 1 will be described later.

The holding unit 2 has the air discharge port 3 which absorbs gas (air) between the substrate and the transport arm 1 in order to hold the substrate byway of the vacuum adsorption and the adsorption member 4 formed so as to surround the air discharge port 3. The air discharge port 3 is connected to an air discharge apparatus (not illustrated) through an air discharge pipe 5 formed in the transport arm 1 toward the terminal side thereof. The gas absorbed through the air discharge port 3 is discharged outward via the air discharge apparatus. Therefore, when holding the substrate, the holding unit 2 discharges the gas through the air discharge port 3 and holds the substrate by way of the vacuum adsorption. When releasing the held substrate, the holding unit 2 stops discharging the gas through the air discharge port 3. An opening shape of the air discharge port 3 is preferably circular, but is not particularly limited thereto.

The "adsorption" in the present invention indicates a state where the substrate is adsorbed with strength to such an extent as to enable the substrate to be stably held and transported. Therefore, an adsorption force required for the "adsorption" in the present invention is a force to such an extent as to avoid damage to the substrate. It is preferable to set 80 kPa or greater and approximately 95 kPa is optimal. In addition, in view of efficiency in transporting, the time to reach the adsorption force is preferably within six seconds after the air discharge apparatus starts the adsorption, more preferably within two seconds, and particularly preferable within one second. Therefore, an opening area of the air discharge port 3 (total areas when multiple air discharge ports 3 are provide) or capacity of the air discharge apparatus may be appropriately set in view of the adsorption force applied to the substrate or efficiency in transporting.

The adsorption member 4 is the squeeze packing, and is more preferably an O-ring or a square ring formed of fluorine resin of a porous material. The O-ring is more preferably the O-ring in which at least a surface thereof is formed of (or coated with) the fluorine resin, and further more preferably is the O-ring in which an entire body is formed of the fluorine resin (for example, perfluoroelastomer). The squeeze packing which is the adsorption member 4 is disposed in a state where a portion thereof is embedded in (fitted to) a groove formed in a main body of the transport arm 1. The squeeze packing comes into close contact with a surface of the substrate by discharging the gas through the air discharge port 3.

The "squeeze packing" in the present invention is an annular packing and indicates a mold packing which is used by being squeezed. In addition, the "O-ring" in the present invention indicates the squeeze packing in a ring shape whose cross-section is circular. The "square ring" in the present invention indicates the squeeze packing in a ring shape whose cross-section is a square shape.

A heat resistant temperature of the squeeze packing is more preferably 200° C. or more, further more preferably 220° C. or more, and particularly preferably 300° C. or more. In addition, it is more preferable that hardness of the squeeze packing be 80 or less so as to be deformed. Furthermore, it is more preferable that the adhesive force of the squeeze packing be 40 N or less so that the substrate can be more stably detached from the transport arm 1 (without adhering to the transport arm 1), and it is much more preferable that the adhesive force be 10 Nor less. If the hardness and the adhesive force fall within the above-described values, it is possible to employ the squeeze packing which can maintain adsorbing capability with excellent detachability. Therefore, it is more preferable to have the values. That is, when the substrate is held by way of the vacuum adsorption, the squeeze packing is squeezed so that the substrate and the squeeze packing come into close contact with each other. In contrast, when the vacuum adsorption is released, the substrate is easily detached from the squeeze packing. In addition, it is more preferable that the squeeze packing be formed of a material having low friction coefficient (for example, the friction coefficient is 0.01 to 1.0, more preferably 0.1 to 0.5).

Figure 3A:
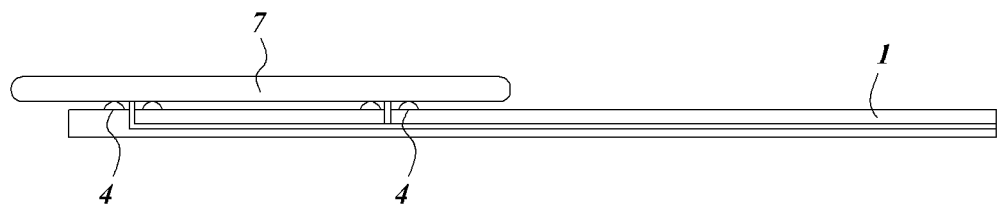
FIGS. 3A to 3C are side views illustrating vacuum adsorption of a substrate when the squeeze packing is an O-ring.
Figure 3B:
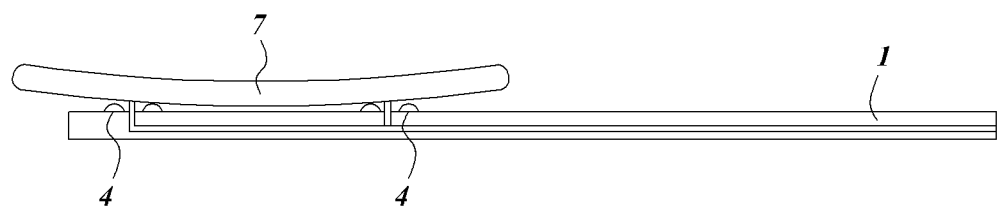
Figure 3C:
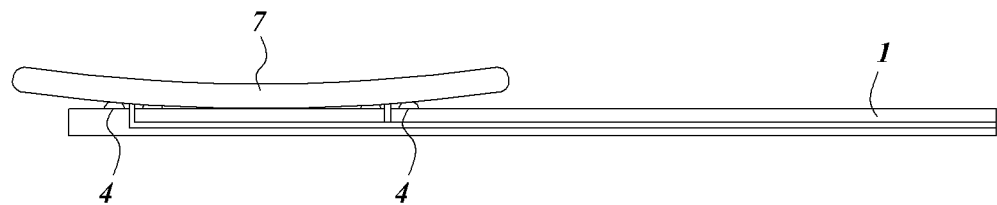
Figure 4A:
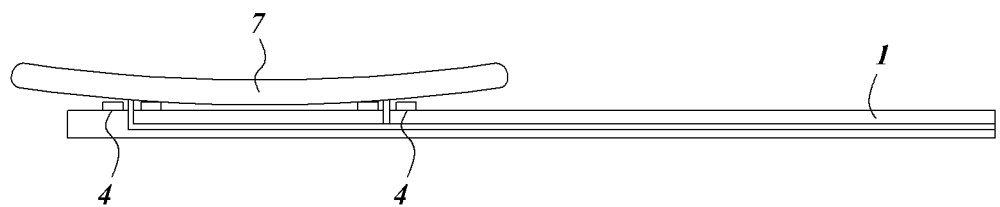
FIGS. 4A and 4B are side views illustrating vacuum adsorption of a substrate when the squeeze packing is a square ring.
Figure 4B:
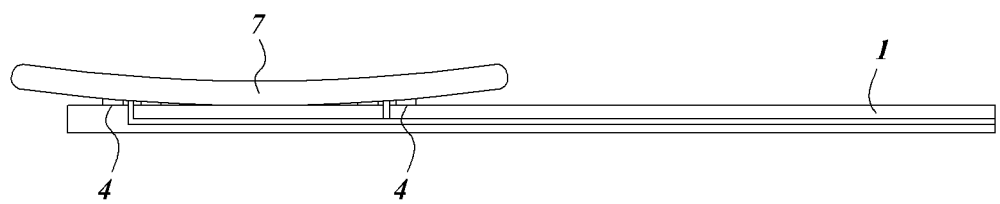

Specifically, as illustrated in FIGS. 3A to 3C, when the squeeze packing which is the adsorption member 4 is the O-ring, it is possible to hold a substrate 7 having a relatively small warp (refer to FIG. 3A). Moreover, even in the substrate 7 having a relatively large warp (refer to FIG. 3B), it is possible to hold the substrate 7 having a relatively large warp in such a manner that the O-ring is squeezed when the substrate 7 is held by way of the vacuum adsorption and the substrate 7 and the O-ring come into close contact with each other (refer to FIG. 3C). Similarly, as illustrated in FIGS. 4A and 4B, even when the squeeze packing which is the adsorption member 4 is the square ring, it is possible to hold the substrate 7 having the relatively small warp. Moreover, even in the substrate 7 having the relatively large warp (refer to FIG. 4A), it is possible to hold the substrate 7 having the relatively large warp in such a manner that the square ring is squeezed when the substrate 7 is held by way of the vacuum adsorption and the substrate 7 and the square ring come into close contact with each other (refer to FIG. 4B).

The "hardness" in the present invention indicates a value measured by using a type A durometer (for general rubber) conforming to JIS K 6253. In addition, the "adhesive force" in the present invention is a peel strength (N) measured by a test method in which the adsorption member is interposed between a pair of aluminum plates in a state of 25% compression, heated at 200° C. for 22 hours and stretched at a tensile speed of 100 mm/min.

When the squeeze packing is the O-ring, for example, fluorocarbon rubber such as Kalrez (brand name) series (manufactured by DuPont) or a commercially available rubber O-ring on which fluorine resin is coated can be used as the O-ring. In addition, when the squeeze packing is the square ring, as the square ring, it is preferable to use the square ring in which at least a surface thereof is formed of a porous material, more preferably formed of porous fluorine resin. Specifically, for example, a porous film formed through a stretching process of polytetrafluoroethylene or a composite material formed by coating polyurethane polymer with the film can be used as the square ring. For example, Gore-Tex (brand name; manufactured by W. L. Gore & Associates, Inc.) can be used. A degree of the above-described porous material is sufficient if the substrate can be stably held and transported, and is not particularly limited. However, it is preferable to have the degree of the porous material which can obtain predetermined hardness.

The diameter of the squeeze packing which is the adsorption member 4 may be appropriately set within a range which enables the substrate to be stably held and transported. However, it is preferable to have an inner diameter of approximately 2 mm to 15 mm, and more preferable to have the inner diameter of approximately 7 mm to 14 mm. In addition, when the substrate has a relatively large amount of warp, it is preferable to set the diameter of the squeeze packing to be smaller. The height of the squeeze packing from the main body of the transport arm 1 may be any height if the substrate does not come into contact with the transport arm 1.

Figure 2:
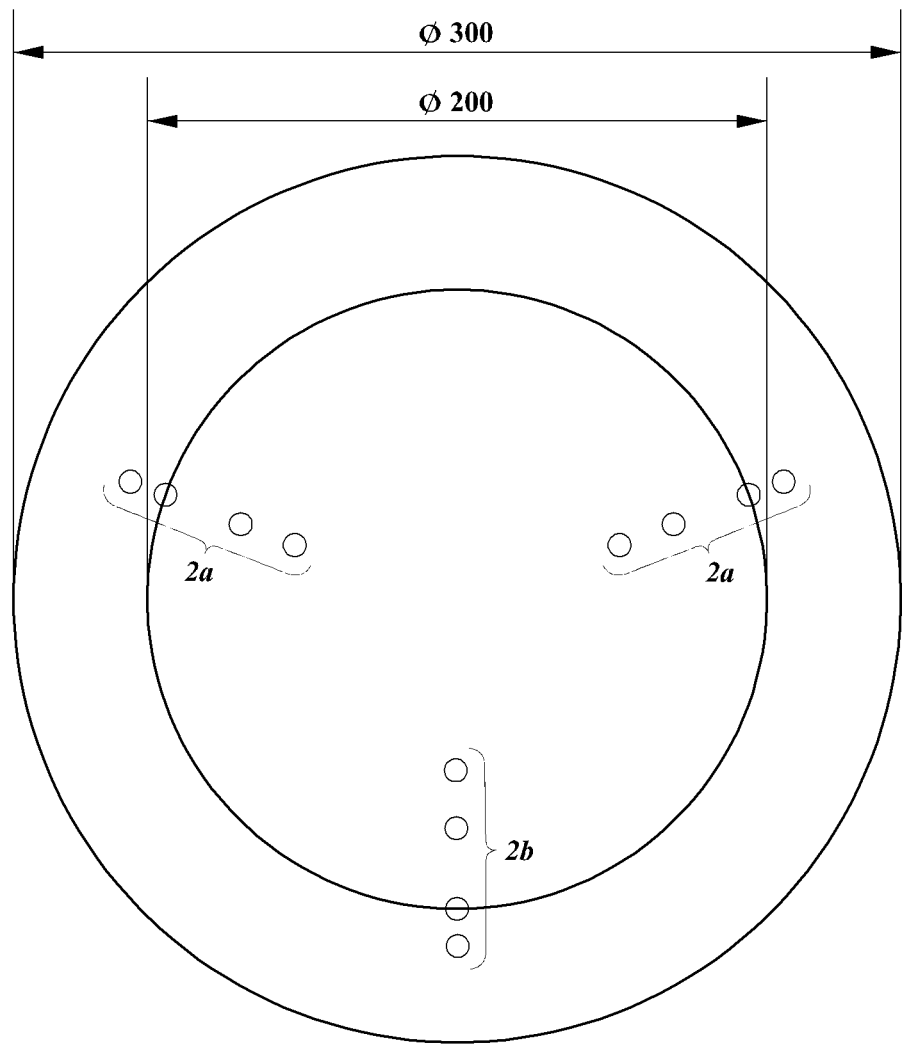
FIG. 2 is a plan view illustrating an example of an arrangement of a squeeze packing in the transport arm.

Next, when the transport arm 1 includes three holding units 2, an example of the arrangement of three holding units 2 in the transport arm 1 is illustrated in FIG. 2. These three holding units 2 may be properly arranged according to the amount of the warp of the substrate. However, as illustrated in FIG. 2, it is preferable to arrange the substrate (in FIG. 2, inner circle) having the diameter of 200 mm so that a pitch circle diameter (PCD) is 92 mm, 127 mm (not illustrated) or 144 mm, for example. For example, it is preferable to arrange the substrate (in FIG. 2, outer circle) having the diameter of 300 mm so that the pitch circle diameter is 200 mm or 230 mm in addition to the above-described diameter, for example. In addition, in each arrangement described above, the angle formed by two holding units 2a located at the tip portion of the transport arm which is formed to be divided in two may be wider than the angle formed by a third holding unit 2b formed at a root of two divided portions and the holding unit 2a. Alternatively, the angles formed by three holding units 2a, 2a and 2b may be respectively equiangular (120°). Then, when the substrate has the relatively large warp, it is preferable to set the pitch circle diameter to be smaller. The arrangement of three holding units 2 when the transport arm 1 includes three holding units 2 is not limited to the example illustrated in FIG. 2. The arrangement can be appropriately set within a range not to cause inconvenience when configuring or using the transport arm 1.

Transport Apparatus and Transport Method

A transport apparatus according to the present invention includes the transport arm according to the present invention and a drive unit that drives the transport arm. Specifically, in the transport apparatus, a terminal side of the transport arm, that is, a side not including the holding unit is connected to the drive unit. The drive unit drives the transport arm to transport the held substrate from a certain process to the next process. A specific configuration of the drive unit is not particularly limited, but can appropriately employ a known drive device used in transporting the substrate. The transport apparatus is used in order to transport the substrate across each process in the wafer handling system, and in particular, preferably used in order to transport the substrate after the heat-treatment process. Therefore, an operation of the transport apparatus, that is, a holding operation or a transport operation of the transport arm which is driven by the drive unit is controlled by a control unit that controls the entire wafer handling system.

In addition, a transport method according to the present invention includes a transport process of holding and transporting the substrate by using the transport arm according to the present invention. Specifically, the transport method includes a positioning process of positioning the transport arm with respect to the substrate, an adsorption process of holding the substrate by way of vacuum adsorption, a transport process of holding and transporting the substrate, and a detachment process of detaching the substrate at a predetermined position after transporting. Therefore, the transport method is employed in transporting the substrate across each process in the wafer handling system, and in particular, preferably employed in transporting the substrate after the heat-treatment process.

As described above, according to the transport arm of the present invention, the adsorption member is the squeeze packing. Therefore, when the substrate is held by way of the vacuum adsorption, the squeeze packing is squeezed, and the substrate and the squeeze packing come into close contact with each other. In contrast, when the vacuum adsorption is released, the substrate is easily detached from the squeeze packing. For that reason, according to the transport arm, the transport apparatus and the transport method of the present invention, it is possible to stably hold and transport the substrate having the warp, the heated substrate, and particularly, even the heated substrate having the warp from a certain process to the next process, and it is possible to stably detach the held substrate therefrom.

Hereinafter, by way of an example, an embodiment of the present invention will be described in further detail. Of course, the present invention is not limited to the following example, and various applications can be made in detailed portions. Furthermore, the present invention is not limited to the above-described embodiment, but can be modified in various ways within the scope of claims. An embodiment obtained by appropriately combining the technical means respectively disclosed herein is also included in the technical scope of the present invention. In addition, all of the documents disclosed in the present specification are incorporated herein by reference.

EXAMPLE

In the present example, the transport arm was configured to hold the substrate from below.

Substrate

The following substrate was prepared as a substrate for evaluating a holding operation of the transport arm.

Si substrate in which the amount of a warp is 29 μm and the diameter is 300 mm (silicon wafer; hereinafter, referred to as a "substrate a")

Si—PI substrate in which the central portion is warped to rise, the amount of the warp is 511 μm, and the diameter is 300 mm (silicon wafer supported by polyimide; hereinafter, referred to as a "substrate b")

MT substrate in which the entire body is warped to be curled, the amount of the warp is 1,276 µm, and the diameter is 300 mm (adhesion body (laminated body) in which a support plate adheres to the Si substrate via an adhesion layer; hereinafter, referred to as a "substrate c")

Then, with regard to the substrate c, a holding operation of the transport arm was evaluated by combining two states, a state where the substrate c is arranged so that the central portion is positioned in the transport arm side (so as to be in a "U" shape) (hereinafter, referred to a "normal position") and a state where the substrate c is arranged so that the warped peripheral portion is positioned in the transport arm side (so as to be in a "reversed U") (hereinafter, referred to as a "reverse position"), and three states, a state where the substrate c is arranged so that the warped peripheral portion is positioned on a central axis (axis which connects the tip side and the terminal side) of the transport arm (hereinafter, referred to as "0°"), a state where the substrate c is arranged so that the warped peripheral portion is positioned at a position orthogonal to the central axis of the transport arm (hereinafter, referred to as "90°"), and a state where the substrate c is arranged so that the warped peripheral portion is positioned at an intermediate position of both arrangements, that is, a position intersecting the central axis of the transport arm by 45° (hereinafter, referred to as "45°") (total six states). In addition, with regard to the substrate b, the holding operation of the transport arm was evaluated in a state where the substrate b is arranged so that the central portion is positioned in the transport arm side (so as to be in the "U" shape).

Evaluation Results

The evaluations on the holding operation of the transport arm were performed based on the following criteria.

"A" . . . adsorption force is 90 kPa or greater

"B" . . . adsorption force is 80 kPa or greater and smaller than 90 kPa

"C" . . . adsorption unavailable or adsorption force is smaller than 80 kPa

The transport arm in the present invention is suitable for practical use if the evaluation is "B" or higher.

Example 1

The transport arm was produced in which three holding units were arranged at equal intervals (interval of 120°) so that the pitch circle diameter was 92 mm, and the holding operation was evaluated. The material of the main body of the transport arm was aluminum. The opening of the air discharge port was 5 mm in diameter. The O-ring of 10 mm in diameter which was coated with the fluorine resin was used as the adsorption member (squeeze packing). The temperature of the substrate was 23° C. Table 1 illustrates the substrates used in the evaluations and the evaluation results.

TABLE 1

| Substrate | a | b | c | | | | | |
|---|---|---|---|---|---|---|---|---|
| Arrangement | — | — | Normal Position | | | Reverse Position | | |
| | | | 0° | 45° | 90° | 0° | 45° | 90° |
| Example 1 Evaluation | A | A | A | A | A | A | B | B |

Comparative Example 1

Except that the adsorption member was not provided, the transport arm was produced in a manner similar to that of Example 1 and the holding operation was evaluated. Table 2 illustrates the substrates used in the evaluations and the evaluation results.

TABLE 2

| Substrate | a | b | c | | | | | |
|---|---|---|---|---|---|---|---|---|
| Arrangement | — | — | Normal Position | | | Reverse Position | | |
| | | | 0° | 45° | 90° | 0° | 45° | 90° |
| Comparative Example 1 Evaluation | A | A | C | C | C | C | C | C |

As is apparent from the results in Tables 1 and 2, according to the transport arm of the present invention, it will be appreciated that even the substrate having the large warp (substrate c) can be stably held.

INDUSTRIAL APPLICABILITY

The transport arm, the transport apparatus and the transport method according to the present invention, can be widely used in a manufacturing process of a miniaturized semiconductor device, for example.

EXPLANATION OF NUMERALS OR LETTERS

1: Transport arm
2: Holding unit
3: Air discharge port
4: Adsorption member (squeeze packing, O-ring, square ring)
5: Discharge pipe While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A transport arm that holds and transports a substrate, comprising:
   three holding units that hold the substrate by way of vacuum adsorption, wherein each holding unit has an air discharge port and an adsorption member formed so as to surround the air discharge port, and wherein the adsorption member is a squeeze packing,
   the transport arm comprising a root from which two divided portions extend,
   two of the three holding units being provided on the two divided portions of the transport arm, respectively, and another one of the three holding units being provided at the root of the two divided portions,
   the three holding units being arranged on the transport arm such that angles formed by any two mutually adjacent holding units among the three holding units with respect to a center of a circle passing through the three holding units are equiangular, and the three holding units each having an adsorption force which is set so as to be 80 kPa or greater and 95 kPa or lower within six seconds after an air discharge apparatus starts adsorption.

2. The transport arm according to claim 1, wherein the adsorption member is an O-ring or a square ring.

3. The transport arm according to claim 2, wherein the O-ring has at least a surface formed of a fluorine resin.

4. The transport arm according to claim 2, wherein the square ring has at least a surface formed of a porous material.

5. The transport arm according to claim 2, wherein a heat resistant temperature of the adsorption member is 200° C. or higher.

6. The transport arm according to claim 2, wherein:
in the adsorption member, the hardness is 80 or less, and
the adsorption member is disposed in a state where a portion of the adsorption member is embedded in the transport arm main body.

7. The transport arm according to claim 2, wherein an adhesive force of the adsorption member is 40 N or less.

8. A transport apparatus comprising:
a transport arm according to claim 1, and
a drive unit that drives the transport arm.

9. A transport method of holding and transporting a substrate that is heated, warped or a combination thereof, comprising:
providing a transport arm comprising a root from which two divided portions extend and three holding units, wherein each holding unit has an air discharge port and a squeeze packing surrounding the air discharge port, wherein two of the three holding units are provided on the two divided portions of the transport arm, respectively, and another one of the three holding units is provided at the root of the two divided portions, the three holding units being arranged on the transport arm such that angles formed by any two mutually adjacent holding units among the three holding units with respect to a center of a circle passing through the three holding units are equiangular;
initiating adsorption from an air discharge apparatus in communication with said air discharge ports;
achieving an adsorption force of 80 kPa to 95 kPa within each holding unit within six seconds after initiating the air discharge apparatus;
holding the substrate by adsorption force from each of the three holding units; and
transporting the substrate without damaging the substrate.

* * * * *